(12) United States Patent
Islam et al.

(10) Patent No.: US 11,460,651 B2
(45) Date of Patent: *Oct. 4, 2022

(54) PHOTONICS PACKAGE INTEGRATION

(71) Applicant: Taiwan Semiconductor Manufacturing Company, Ltd., Hsinchu (TW)

(72) Inventors: Rabiul Islam, Hsinchu (TW); Stefan Rusu, Sunnyvale, CA (US); Nick Samra, Austin, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/086,646

(22) Filed: Nov. 2, 2020

(65) Prior Publication Data

US 2021/0072474 A1 Mar. 11, 2021

Related U.S. Application Data

(63) Continuation of application No. 16/282,075, filed on Feb. 21, 2019, now Pat. No. 10,823,921.

(60) Provisional application No. 62/764,710, filed on Aug. 15, 2018.

(51) Int. Cl.
| | |
|---|---|
| *G02B 6/43* | (2006.01) |
| *G02B 6/42* | (2006.01) |
| *H01L 33/58* | (2010.01) |
| *H01L 33/62* | (2010.01) |

(52) U.S. Cl.
CPC ............... *G02B 6/43* (2013.01); *G02B 6/424* (2013.01); *G02B 6/4204* (2013.01); *H01L 33/58* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 6,795,624 | B2 | 9/2004 | Wickman et al. |
| 8,831,437 | B2 | 9/2014 | Dobbelaere et al. |
| 9,335,473 | B2 | 5/2016 | Lai et al. |
| 9,513,447 | B1 * | 12/2016 | Celo .................... G02B 6/1225 |
| 9,678,271 | B2 | 6/2017 | Thacker et al. |
| 9,874,688 | B2 | 1/2018 | Doerr et al. |
| 10,552,353 | B1 * | 2/2020 | Farjadrad .............. H04L 7/0091 |
| 10,823,921 | B2 * | 11/2020 | Islam ..................... H01L 33/58 |
| 2003/0099018 | A1 | 5/2003 | Singh et al. |
| 2013/0308898 | A1 | 11/2013 | Doerr et al. |

(Continued)

FOREIGN PATENT DOCUMENTS

| | | |
|---|---|---|
| CN | 101521194 A | 9/2009 |
| CN | 103312415 A | 9/2013 |

(Continued)

*Primary Examiner* — Omar R Rojas
(74) *Attorney, Agent, or Firm* — Merchant & Gould P.C.

(57) ABSTRACT

An interconnect package integrates a photonic die, an electronic die, and a switch ASIC into one package. At least some of the components in the electronic die, such as, for example, the serializer/deserializer circuits, transceivers, clocking circuitry, and/or control circuitry are integrated into the switch ASIC to produce an integrated switch ASIC. The photonic die is attached and electrically connected to the integrated switch ASIC.

20 Claims, 13 Drawing Sheets

(56) References Cited

U.S. PATENT DOCUMENTS

2014/0029888 A1  1/2014  La Porta et al.
2014/0321804 A1  10/2014  Thacker et al.
2018/0052281 A1  2/2018  Kuo et al.
2019/0036618 A1  1/2019  Hasharoni

FOREIGN PATENT DOCUMENTS

| CN | 107111086 A | 8/2017 |
| CN | 107768303 A | 3/2018 |
| TW | 201643488 A | 12/2016 |
| TW | 201816946 A | 5/2018 |

* cited by examiner

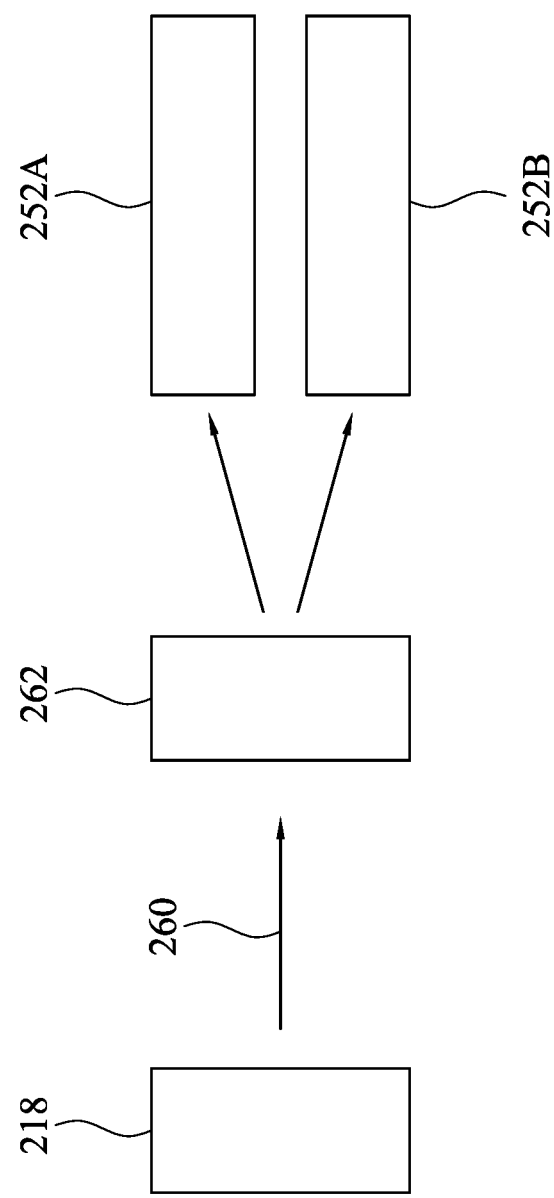

PHOTONICS PACKAGE INTEGRATION

CROSS-REFERENCE TO RELATED APPLICATION(S)

This application is a continuation application of U.S. patent application Ser. No. 16/282,075, entitled "PHOTONICS PACKAGE INTEGRATION," filed Feb. 21, 2019, which application claims priority to U.S. Provisional Application No. 62/764,710 entitled "SILICON PHOTONICS PACKAGE INTEGRATION," filed on Aug. 15, 2018, the entire disclosures of which are hereby incorporated by reference.

BACKGROUND

Optical interconnect systems used to transmit data between computing devices generally provide higher bandwidths than electrical interconnects, such as copper wires. However, some optical interconnect systems use a discrete electronic die (eDie) and a discrete photonic die (pDie) for each individual lane, where the components on the eDie at least in part process and/or control the signals transmitted from the pDie and the signals received by the pDie. The use of two discrete dies can be expensive and inefficient in terms of power consumption and the amount of area needed to provide the total number of discrete dies.

Additionally, in some implementations, the use of a discrete eDie and a discrete pDie can result in the eDie being separated from the switch ASIC by a significant distance. This distance can reduce the performance of the optical interconnect system and result in higher latency. Also due to the distance, large serializer/deserializer (serdes) circuits may be needed to drive the data to the switch ASIC. A serdes circuit includes a serializer and a deserializer that are used to compensate for limited input/output. The serdes circuits facilitate the transmission of data by converting parallel data to serial data (and vice versa). The serdes circuits can further increase the cost of a communication system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2D depicts sharing a light source in accordance with some embodiments;

DETAILED DESCRIPTION

Figure 1:
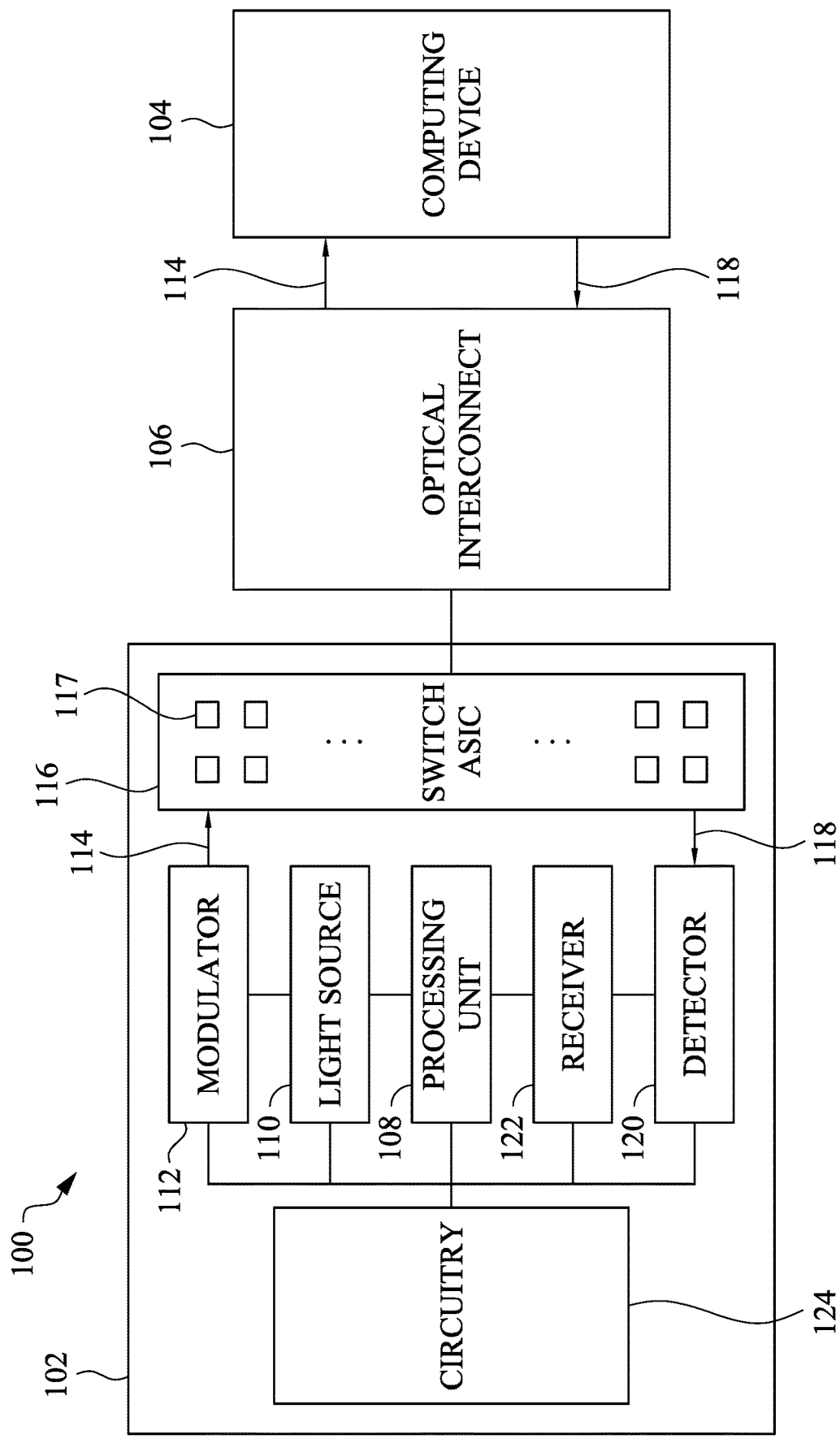
FIG. 1 illustrates a block diagram of an optical communication system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein disclose an optical interconnect that integrates a photonic die (pDie), an electronic die (eDie), and a switch ASIC into one package. Additionally, at least some of the components in the eDie are integrated into the switch ASIC. In some aspects, multiple discrete photonic dies are combined into one or more clusters of detectors (and optionally light sources) on one or more sides of the switch ASIC or the interconnect package. This facilitates combining the light sources such that each light source may provide light to multiple waveguides or optical interconnects.

FIG. 1 illustrates a block diagram of an optical communication system in accordance with some embodiments. The optical communication system 100 includes a first computing device 102 transmitting optical signals to, and receiving optical signals from, a second computing device 104 via optical interconnect 106. Optical interconnect 106 can include, for example, optical waveguides (e.g., single mode or multi-mode optical fibers) and/or free-space optical communication.

The first and second computing devices 102, 104 can be implemented as any type of computing device. One example of a computing device is a server. Although not shown in FIG. 1, the second computing device 104 can include some or all of the components shown in the first computing device 102. The first computing device 102 includes one or more processing units (referred to as processing unit 108) operably connected to one or more light sources (referred to as light source 110). Any suitable type of light source can be used. For example, the light source 110 may be a laser (e.g., multi-wavelength laser).

When data is to be transmitted from the first computing device 102 to the second computing device 104, light emitted by the light source 110 is received by light modulator 112, which modulates the light emitted from the light source 110. The light modulator 112 can perform any suitable type of modulation, including amplitude modulation, phase modulation, and polarization modulation. The modulated light 114 is received by a switch ASIC 116. The switch ASIC 116 includes one or more switches 117 that route the modulated light 114 to the optical interconnect 106. The modulated light 114 propagates through the optical interconnect 106 to the second computing device 104.

When data is to be transmitted from the second computing device 104 to the first computing device 102, light modulated 118 is transmitted from the second computing device 104 through the optical interconnect 106 to the switch ASIC 116. The modulated light 118 is detected by one or more detectors (referred to a detector 120). The detector 120 converts the light into an electrical signal. The electrical signal is received by one or more receivers (referred to as receiver 122) and may be processed by processing unit 108.

Circuitry 124 can be operably connected to the modulator 112, the light source 110, the processing unit 108, the receiver 122, and the detector 120. The circuitry 124 may include circuitry that is used to provide control, logic, and power signals to the modulator 112, the light source 110, the processing unit 108, the receiver 122, and the detector 120. The circuitry 124 can include circuitry that is used to process signals provided to and/or received from the modulator 112, the light source 110, the processing unit 108, the receiver 122, and the detector 120. For example, in one embodiment, the circuitry 124 can include one or more serdes, one or more transceivers, clocking circuitry, and control logic and circuitry.

As disclosed herein, a photonic die (pDie), an electronic die (eDie), and a switch ASIC are integrated into one interconnect package. Additionally, at least some of the components on the eDie are integrated with the switch ASIC to produce an integrated switch ASIC. The components of the eDie can include, but are not limited to, at least one of: one or more serdes, one or more transceivers, clocking circuitry, and control logic and circuitry. The integration of the eDie with the switch ASIC can reduce the distance between the serdes and the switch logic, which in turn may reduce the size and the power consumption of the serdes. In a non-limiting example, the size of the serdes may be reduced by approximately 25%, and/or the power consumption can be reduced by approximately 22%. In some instances, through-silicon vias are not needed in the integrated switch ASIC and/or the first substrate to electrically connect the various components.

Figure 2A:
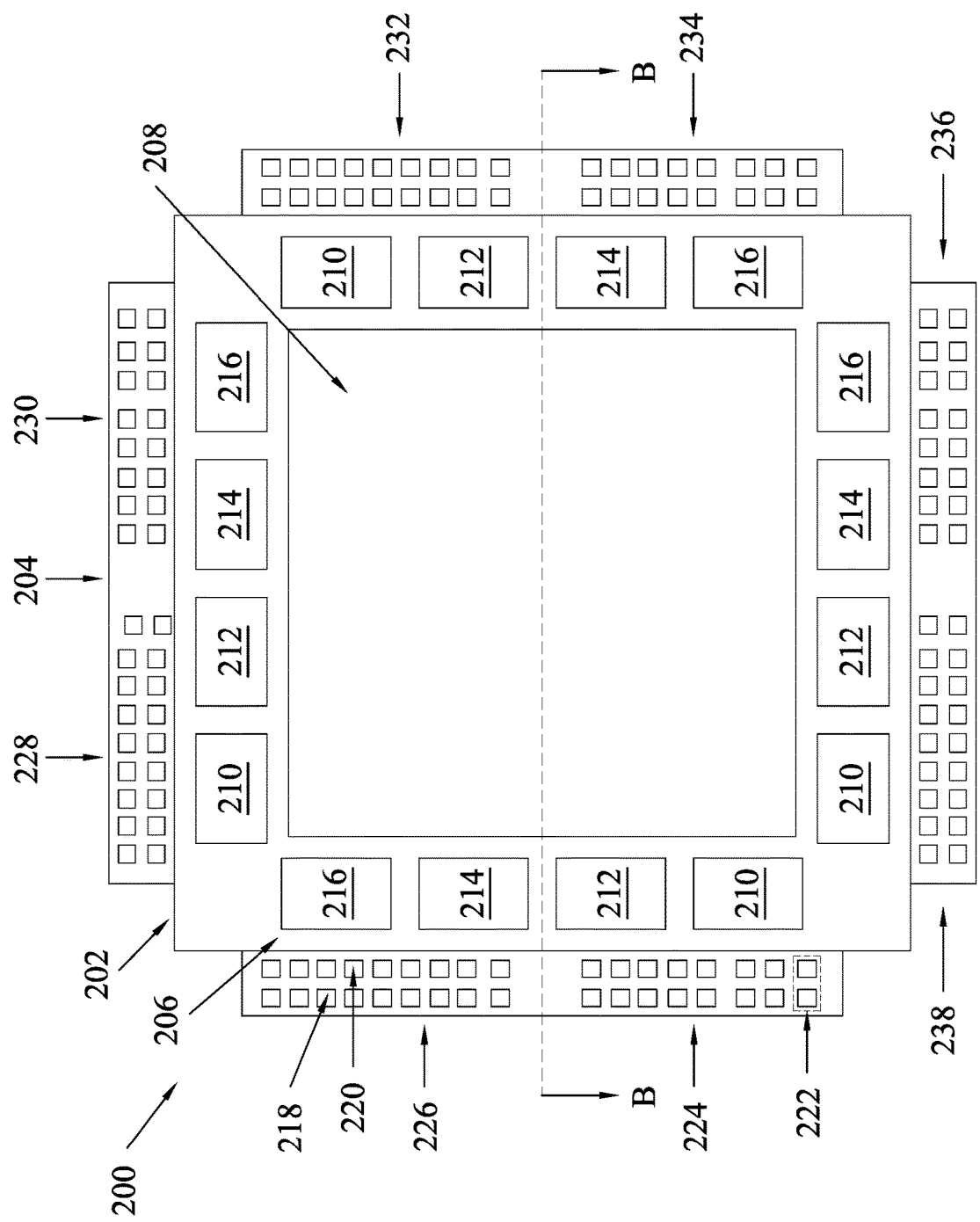
FIG. 2A depicts a block diagram of a first example of an interconnect package in accordance with some embodiments.

FIG. 2A depicts a block diagram of a first example of an interconnect package in accordance with some embodiments. The interconnect package 200 includes an integrated switch ASIC 202 and a pDie 204. The integrated switch ASIC 202 integrates at least some of the components on the eDie 206 with the switch ASIC 208. Circuitry such as the serdes 210, transceivers 212, clocking circuits 214, and/or control logic 216 of the eDie 206 are physically integrated with the switch ASIC 208 as one floorplanned design. The switch ASIC 208, serdes circuitry 210, transceiver circuitry 212, clocking circuitry 214, and/or control logic circuitry 216 can be arranged in the integrated switch ASIC 202 in any suitable configuration. In one embodiment, the serdes circuitry 210, transceiver circuitry 212, clocking circuitry 214, and/or control logic circuitry 216 are disposed along the periphery or edges of the switch ASIC 208.

In the illustrated embodiment, the pDie 204 includes the light sources 218, detectors 220, and modulators (see 112 in FIG. 1). The light sources and the detectors may be arranged into one or more clusters of pairs 222 of light sources 218 and detectors 220. In FIG. 2A, the pDie 204 is shown with eight clusters 224, 226, 228, 230, 232, 234, 236, 238 of eight pairs 222 of light sources 218 and detectors 220. Other embodiments may include one or more clusters on two or more sides of the integrated switch ASIC 202 or the interconnect package 200, with each cluster including one or more pairs 222 of light sources 218 and detectors 220. For example, in one embodiment, a cluster including one pair 222 of a light source 218 and a detector 220 can be positioned on two sides of the integrated switch ASIC 202 or the interconnect package 200. Other embodiments are not limited to positioning the pair(s) 222 of light sources 218 and detectors 220 on the sides of the integrated switch ASIC 202 or the interconnect package 200. The pair(s) 222 of light sources 218 and detectors 220 can be disposed at any suitable location in the interconnect package 200.

Figure 2B:
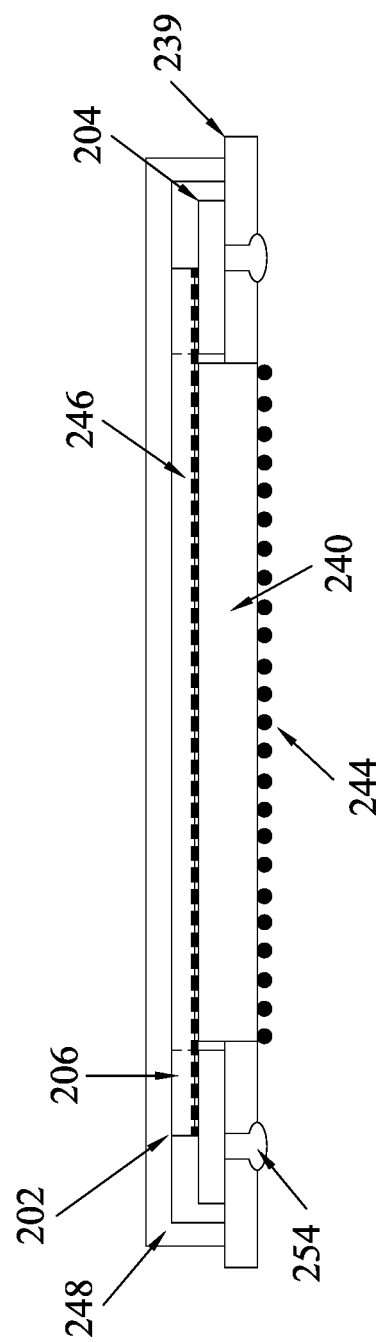
FIG. 2B illustrates a cross-sectional view along line B-B of the interconnect package shown in FIG. 2A.

FIG. 2B illustrates a cross-sectional view along line B-B of the interconnect package shown in FIG. 2A. The eDie 206 in the integrated switch ASIC 202 is electrically connected to the pDie 204 and to a first substrate 240. In the illustrated embodiment, the pDie 204 is positioned in a cutout or shelf 239 formed in the first substrate 240. The first substrate 240 is attached (and optionally electrically connected) to a second substrate 242 (see FIG. 2C) using any suitable attachment technique. For example, package bumps 244 can be used to attach the first substrate 240 to the second substrate 242. In one embodiment, the first substrate 240 is an interposer and the second substrate is a printed circuit board (e.g., a motherboard).

In some aspects, the eDie 206 is positioned face down and electrically connected to the pDie 204. Any suitable method can be used to electrically connect the eDie 206 to the pDie 204. For example, as shown in FIG. 2B, conductive bumps 246, such as controlled collapse chip connection (C4) bumps, are used to electrically connect the eDie 206 to the pDie 204. The conductive bumps 246 also attach the integrated switch ASIC 202 to the pDie 204 and to the first substrate 240. In some embodiments, a heat spreader 248 can be positioned over the interconnect package 200 and affixed to the first substrate 240, the second substrate 242, or another substrate or component.

Figure 2C:
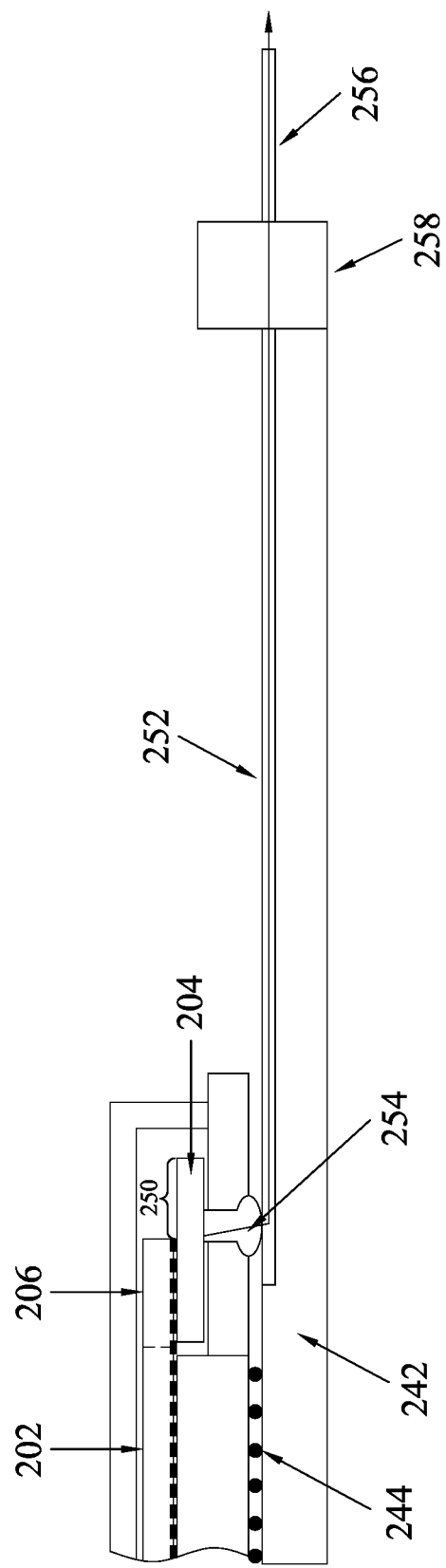
FIG. 2C depicts a cross-sectional view along line B-B of a portion the interconnect package shown in FIG. 2A, with the interconnect package attached to a substrate and optically connected to an optical interconnect.

FIG. 2C depicts a cross-sectional view along line B-B of a portion the interconnect package shown in FIG. 2A, with the interconnect package attached to a substrate and optically connected to an optical interconnect. In some embodiments, the pDie 204 is a silicon-on-insulator (SOI) chip that is hybrid integrated face-to-face with the integrated switch ASIC 202 (e.g., the eDie 206) in a diving-board configuration. In the diving-board configuration, a portion of the pDie 204 extends beyond an edge of the integrated switch ASIC 202. The diving-board configuration can provide easy access and physical space for attachments to one or more other components. For example, optical couplers (e.g., lenses) for optical fibers and light sources 218 can be attached to the exposed surface 250 of the pDie 204.

As shown in FIG. 2C, one or more waveguides (referred to as waveguide 252) are embedded in the second substrate 242. One or more lenses (referred to as lens 254) is formed in an opening in the first substrate 240. The lens 254 is aligned with the embedded waveguide 252 and optically couples (optically aligned with) one or more light sources in the pDie 204 with the embedded waveguide 252. Any suitable type of lens can be used. For example, in the illustrated embodiment, the lens 254 is a polymer lens. In some instances, the lens 254 is a lens array that functions similar to bumps.

Other embodiments are not limited to positioning a lens in the opening. Any suitable optical element that directs or guides light to and from the pDie 204 can be disposed in (or positioned around) the opening. In some instances, one or more optical elements can be positioned in, above, and/or below an opening to direct light to and from the pDie 204.

Light emitted by one or more light sources on the pDie 204 passes through the lens 254 and is directed to the embedded waveguide 252. The light propagates through the embedded waveguide 252 to an optical interconnect 256 (e.g., an optical fiber). The optical interconnect 256 optically couples to the embedded waveguide 252 through connector 258.

In some embodiments, the light sources 218 in a cluster of the pDie 204 can be optically coupled to two or more embedded waveguides, which can reduce the number of light sources on the pDie 204. FIG. 2D depicts a light source optically coupled to two waveguides in accordance with some embodiments. In the illustrated embodiment, the light source 218 can be a multi-wavelength light source. Light 260 emitted by the light source 218 impinges on an optical element 262. The optical element 262 causes the light to be received by the embedded waveguides 252A, 252B. In some instances, the light 260 can be modulated such that one or more parameters of the light is manipulated to transmit an optical signal representing different data through the embedded waveguides 252A, 252B.

Figure 3:
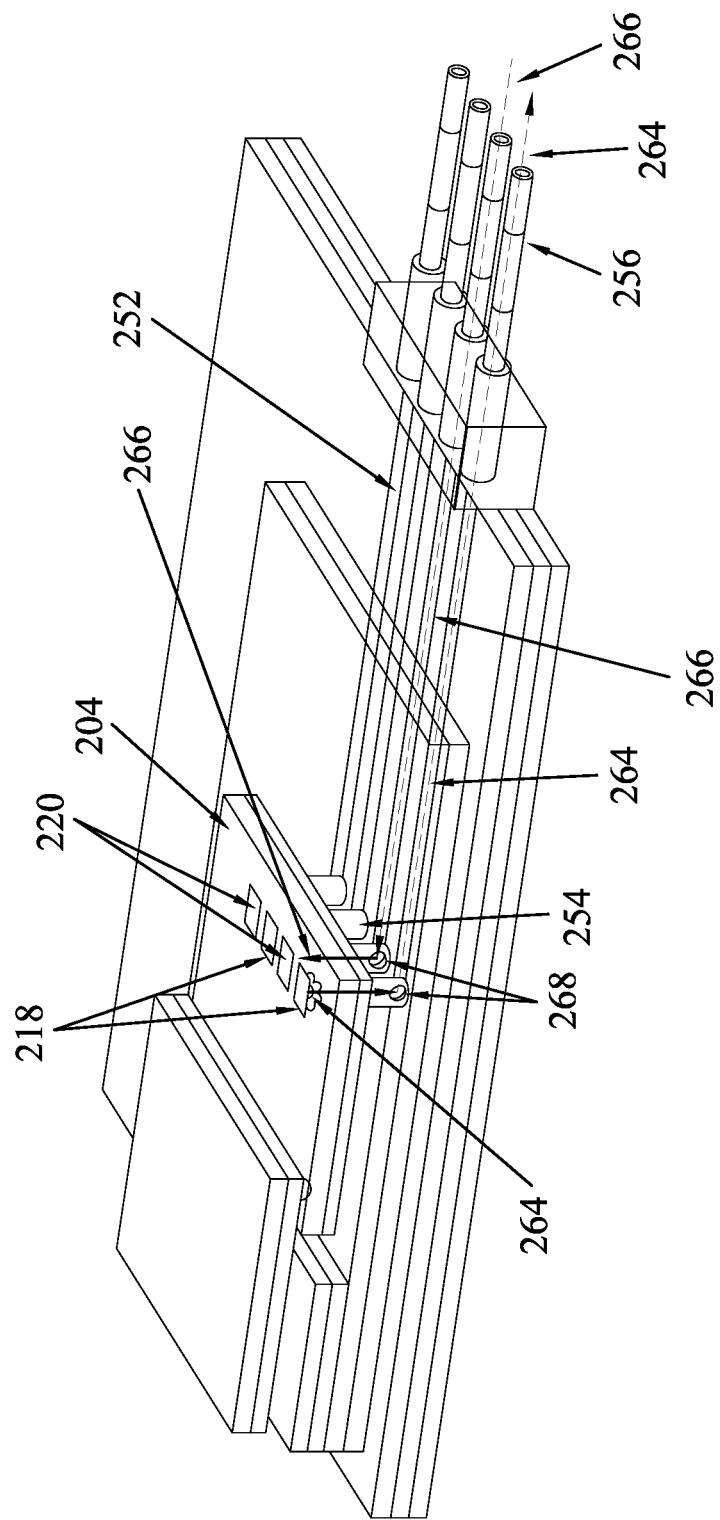
FIG. 3 illustrates a perspective view of a second example of an interconnect package attached to a substrate in accordance with some embodiments.

FIG. 3 illustrates a perspective view of a second example of an interconnect package attached to a substrate in accordance with some embodiments. As described earlier, the pDie 204 includes one or more pairs of light sources 218 and detectors 220. As shown in FIG. 3, light 264 emitted by a light source 218 passes through a respective lens 254 to a respective embedded waveguide 252. The light 264 propagates through the embedded waveguide 252 to a respective optical interconnect 256 (e.g., an optical fiber). In FIG. 3, the light 264 is represented diagrammatically by a starburst around the light source 218, by the arrow input into the embedded waveguide 252, and by the arrow output from the optical interconnect 256.

When light 266 is received from a respective optical interconnect 256, the light propagates through a respective embedded waveguide 252 and a respective lens 254 to be detected by a detector 220. In FIG. 3, the light 266 is represented by the line input into the optical interconnect 256, by the arrow in the embedded waveguide 252, and by the arrow output from the lens 254. In some embodiments, one or more optical elements 268, such as mirrors, can be positioned between a lens 254 and an embedded waveguide 252 to direct the light 264 into the embedded waveguide 252 or to direct the light 266 to a detector 220.

Figure 4A:
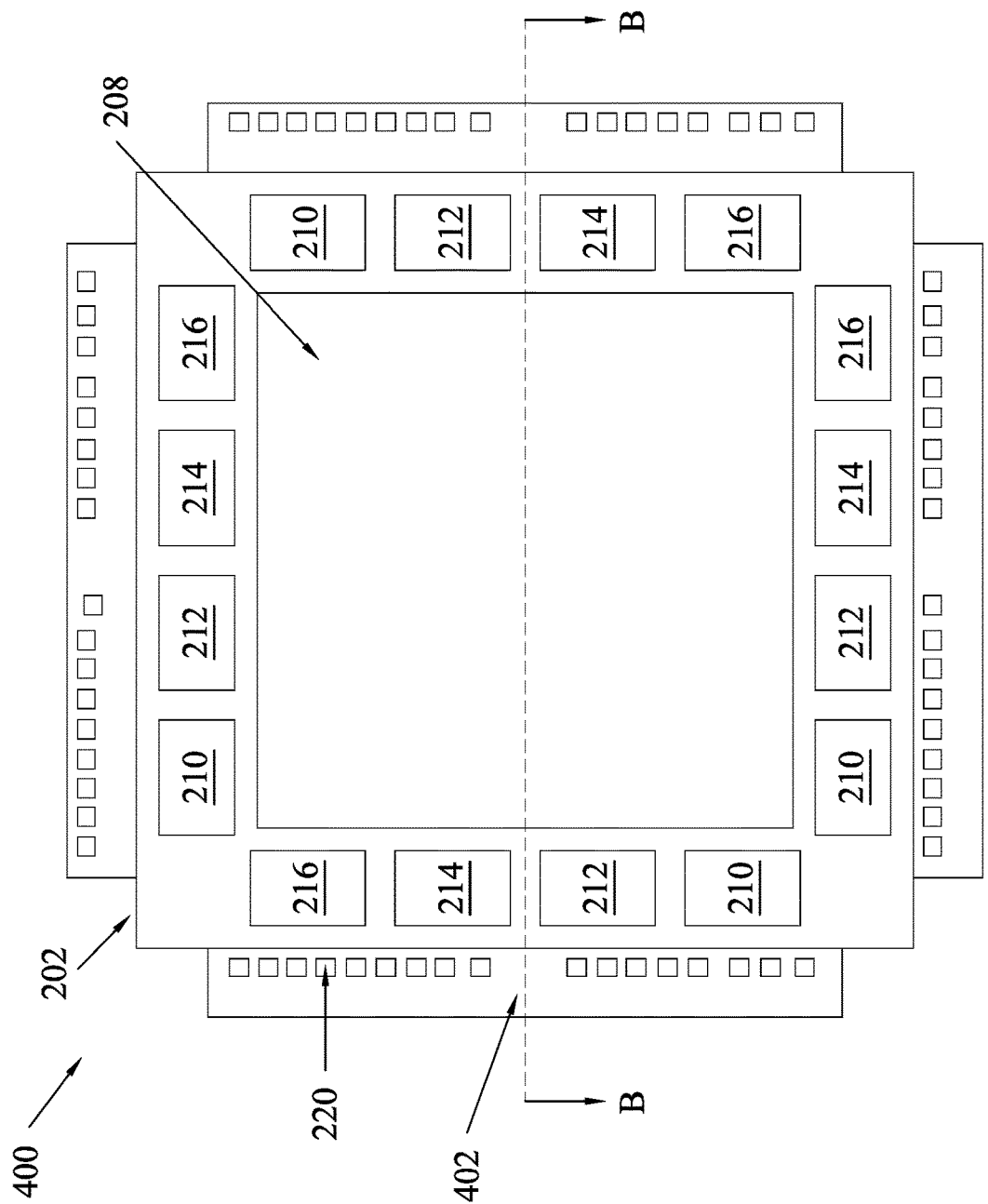
FIG. 4A depicts a block diagram of a third example of an interconnect package in accordance with some embodiments.
Figure 4B:
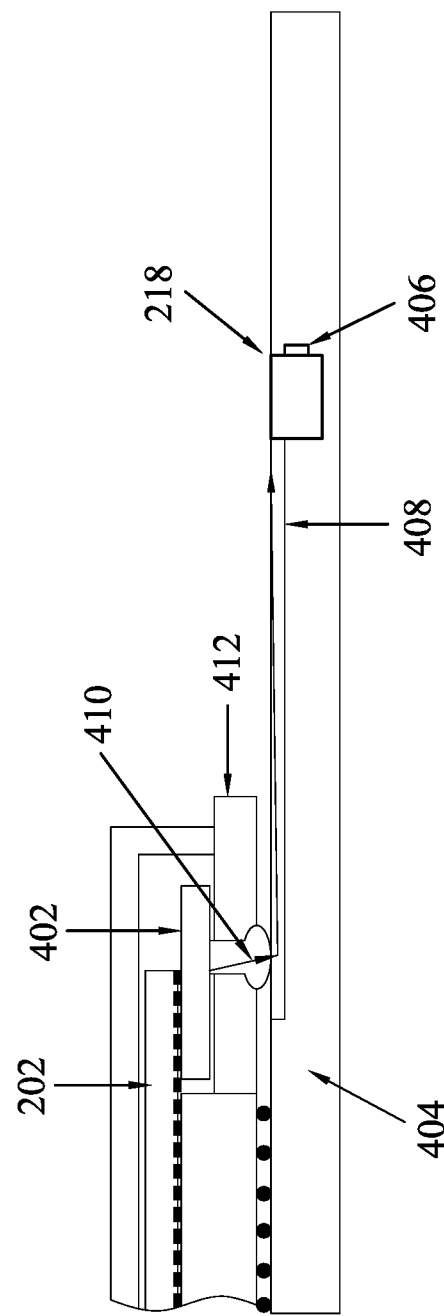
FIG. 4B depicts a cross-sectional view along line B-B of a portion the interconnect package shown in FIG. 4A, with the interconnect package attached to a substrate.

FIG. 4A depicts a block diagram of a third example of an interconnect package in accordance with some embodiments. FIG. 4B depicts a cross-sectional view along line B-B of a portion the interconnect package shown in FIG. 4A, with the interconnect package attached to a substrate. In the illustrated embodiment, the interconnect package 400 is similar to the interconnect package in FIGS. 2A-3 except that the light source 218 is not on the pDie 402. Instead, the light source 218 is moved from the pDie 402 to the second substrate 404 while the detector 220 and the modulator (e.g., 112 in FIG. 1) remain on the pDie 402. The light source 218 has an input or connector 406 in the second substrate 404 to provide power and control signals to the light source 218.

When light is to be transmitted from the interconnect package 400, light is emitted by the light source 218 and propagates through the embedded waveguide 408 to a lens 410 formed in an opening of a first substrate 412 (e.g., an interposer). The lens 410 directs the light to a modulator (see e.g., 112 in FIG. 1) and to the integrated switch ASIC 202. The modulated light then passes through the lens 410 (or through another lens (e.g., 254 in FIG. 2C)) to an embedded waveguide and onto an optical interconnect (e.g., 256 in FIG. 2C).

When light is to be received by the interconnect package 400, light is received from an optical interconnect (e.g., 256 in FIG. 2C) and propagates through an embedded waveguide to a lens formed in an opening of the first substrate 412 (e.g., lens 254 or 410). The lens directs the light to a detector 220 in the pDie 402.

One advantage to the embodiment shown in FIGS. 4A and 4B is that the entire interconnect package 400 does not need to be disposed of when the light source 218 malfunctions or is not operating. Instead, the light source 218 can be repaired or replaced. When the interconnect package 400 includes multiple light sources, each light source may be repaired or replaced individually without impacting the other light sources, the pDie 402, or the interconnect package 400.

Figure 5:
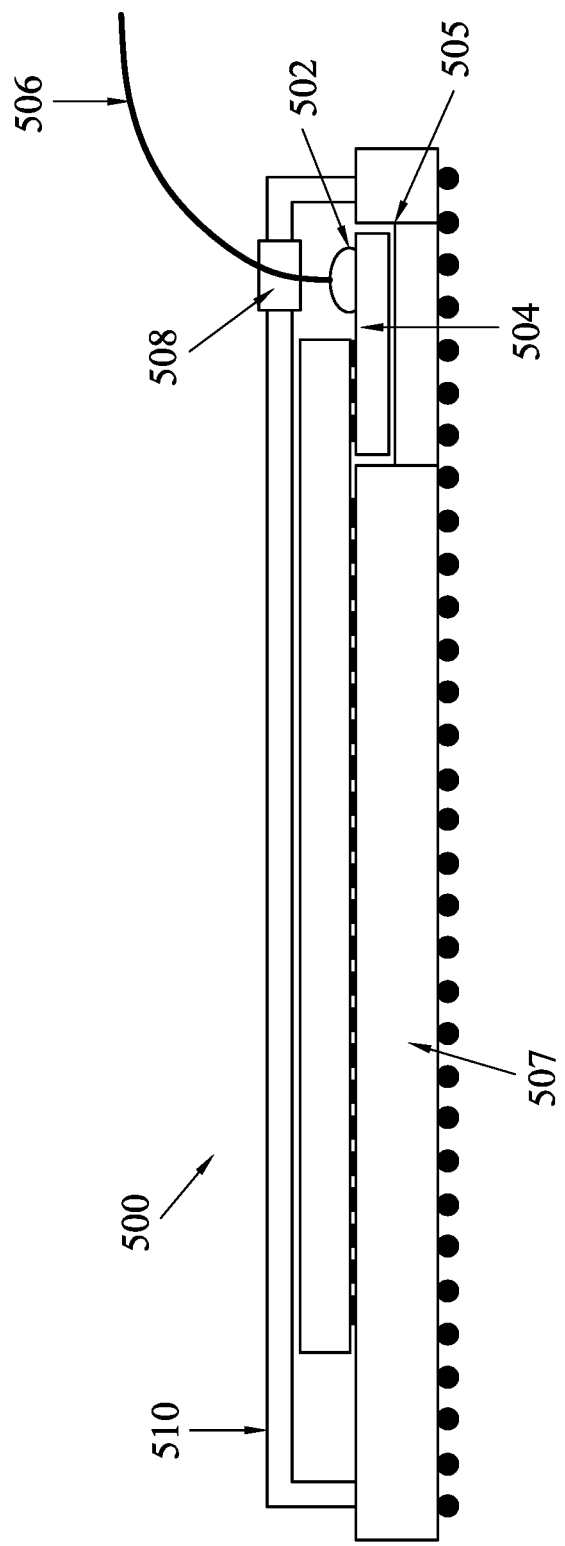
FIG. 5 depicts a cross-sectional view of a fourth example of an interconnect package in accordance with some embodiments.

FIG. 5 depicts a cross-sectional view of a fourth example of an interconnect package in accordance with some embodiments. As shown in FIG. 5, the interconnect package 500 includes one or more optical elements (referred to as optical element 502) that is attached to a surface of the pDie 504. For example, in the illustrated embodiment, the optical element 502 is attached to the exposed surface 250 (see FIG. 2) of the pDie 504. Any suitable type of optical element can be used. One example of an optical element is a lens.

The pDie 504 can be implemented as the pDie 204 in that the light source 218 and the detector 220 are on the pDie 504. Alternatively, the pDie 504 may be implemented as the pDie 402 with the one or more light sources embedded in the second substrate. In the illustrated embodiment, the pDie 504 is positioned in a recess or cutout 505 formed in a substrate 507 (e.g., a first substrate).

One or more optical interconnects (referred to as optical interconnect 506), such as an optical fiber, passes through a connector 508 formed in a heat spreader 510. The optical interconnect 506 is attached and optically coupled to the optical element 502. When light is transmitted from the interconnect package 500, light emitted by a light source on the pDie 504 (see e.g., 218 in FIG. 2A) passes through or is manipulated by the optical element 502 and is directed to the optical interconnect 506. When light is received by the interconnect package 500, the light that propagated through the optical interconnect 506 is received or manipulated by the optical element 502 and detected by a detector in the pDie 504 (e.g., detector 220 in FIG. 2A).

Figure 6:
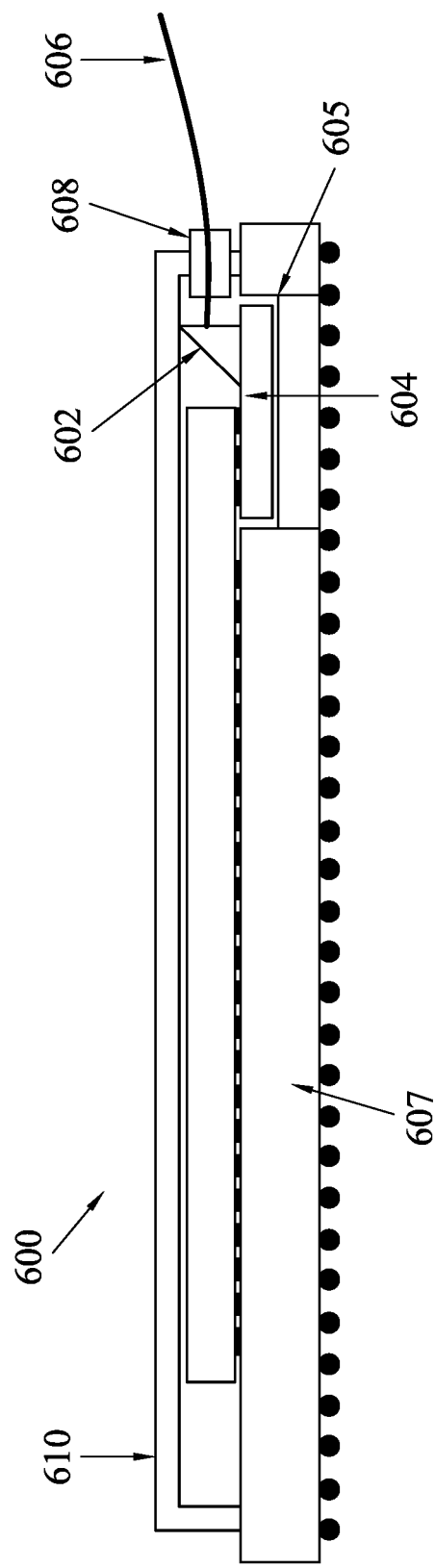
FIG. 6 depicts a cross-sectional view of a fifth example of an interconnect package in accordance with some embodiments.

FIG. 6 illustrates a cross-sectional view of a fifth example of an interconnect package in accordance with some embodiments. As shown in FIG. 6, the interconnect package 600 includes one or more optical elements (referred to as optical element 602) that is attached to a surface of the pDie 604. For example, in the illustrated embodiment, the optical element 602 comprises a lens that is attached to the exposed surface 250 (see FIG. 2) of the pDie 604. Any suitable type of optical element can be used. For example, the optical element 602 may be a ninety degree lens.

The pDie 604 can be implemented as the pDie 204 in that the light source 218 and the detector 220 are on the pDie 604. Alternatively, the pDie 604 may be implemented as the pDie 402 with the one or more light sources embedded in the second substrate. In the illustrated embodiment, the pDie 604 is positioned in a recess or cutout 605 formed in a substrate 607 (e.g., a first substrate).

One or more optical interconnects (referred to as optical interconnect 606), such as an optical fiber, extend through a connector 608 formed in a heat spreader 610. The optical interconnect 606 is attached and optically coupled to the optical element 602. When light is transmitted from the interconnect package 600, light emitted by a light source on the pDie 604 (see e.g., 218 in FIG. 2A) passes through or is manipulated by the optical element 602 and is directed to the optical interconnect 606. When light is received by the interconnect package 600, the light that propagated through the optical interconnect 606 is received or manipulated by the optical element 602 and detected by a detector in the pDie 604 (e.g., detector 220 in FIG. 2A).

Although only one optical element and one connector are shown in FIGS. 5 and 6, other embodiments are not limited to this configuration. Any suitable number of optical elements and/or connectors can be used in other embodiments.

Figure 7:
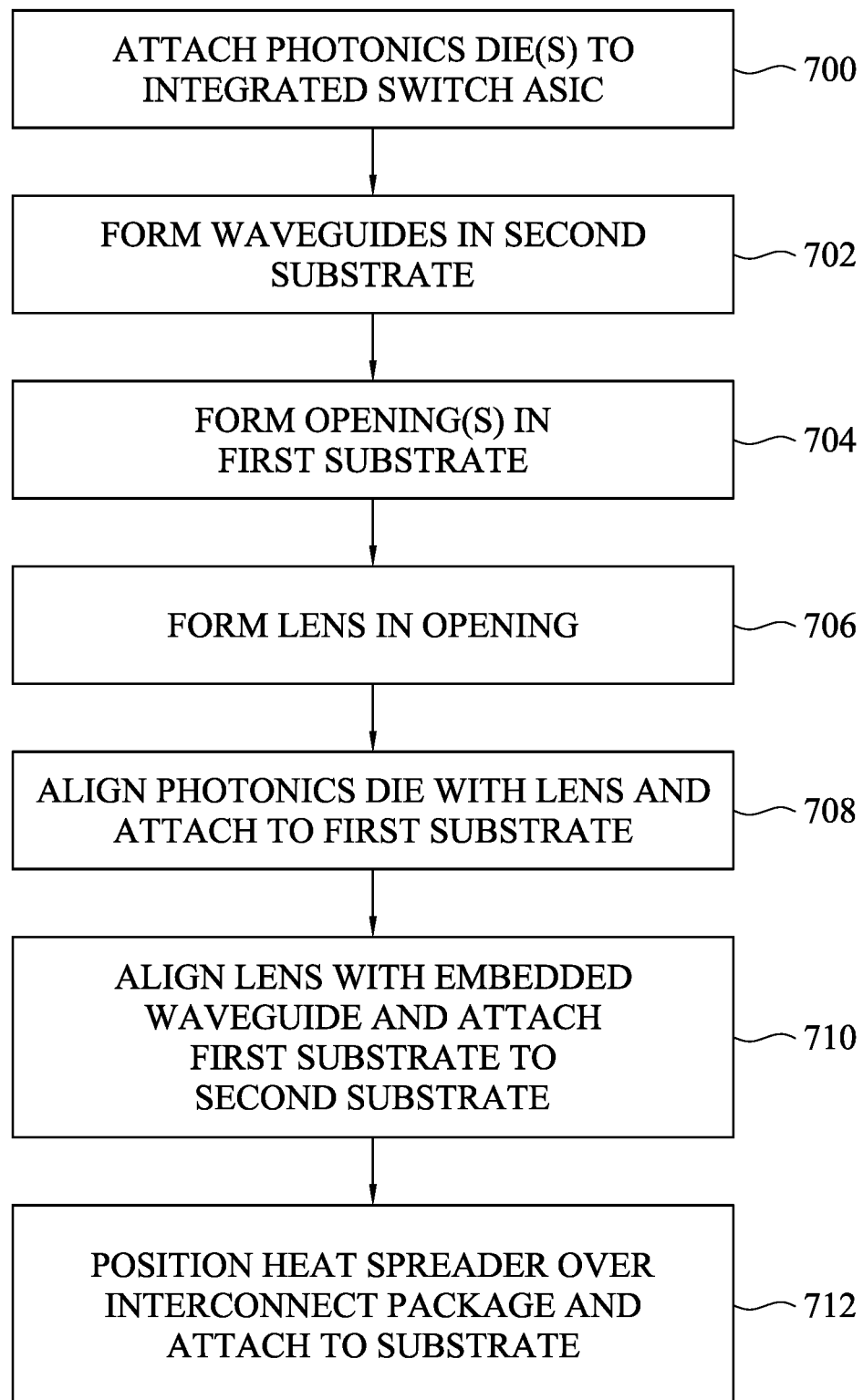
FIG. 7 is a flowchart of a first example method for forming an interconnect package in accordance with some embodiments.

FIG. 7 is a flowchart of a first example method for forming an interconnect package in accordance with some embodiments. In one embodiment, the process of FIG. 7 can be used to construct the interconnect package shown in FIGS. 2A-3. Initially, at block 700, one or more photonics dies 204 is attached to an integrated switch ASIC 202. As described earlier, the one or more photonics dies 204 is attached to the integrated switch ASIC 202 and at least electrically connected to the components of the eDie 206 (e.g., serdes, control circuitry, transceivers, and/or clocking circuitry). Any suitable technique can be used to attach the photonic die(s) to the integrated switch ASIC. For example, conductive bumps can be used to attach the pDie to the integrated switch ASIC.

Next, as shown in block 702, one or more waveguides 252 are formed in a second substrate 242, such as a printed circuit board. The one or more waveguides can be formed using any suitable technique. For example, in one embodiment, the waveguide(s) may be etched into the second substrate.

One or more openings are then formed in a first substrate 240 and a lens 254 is formed in each opening (blocks 704, 706). The openings can be formed in the first substrate 240 using any suitable technique, such as drilling the openings in the first substrate. Similarly, each lens 254 can be formed using any suitable technique. For example, the material of the lens can be deposited in the opening(s) and thermally processed.

Each photonics die 204 is optically aligned with a lens 254 and at least the integrated switch ASIC 202 is attached to the first substrate 240 (block 708). Next, as shown in block 710, the lens(es) 254 are optically aligned with the embedded waveguide(s) 252 and the first substrate 240 is attached to the second substrate 242. Any suitable technique can be used to attach the first substrate to the second substrate. One example of an attachment technique is solder or flip chip bumps.

At block 712, a heat spreader 248 can be positioned over the interconnect package and attached to a substrate (e.g., the first substrate, the second substrate, or another substrate). Any suitable technique can be used to attach the heat spreader to the substrate. For example, the heat spreader can be attached to the substrate using an adhesive.

Figure 8:
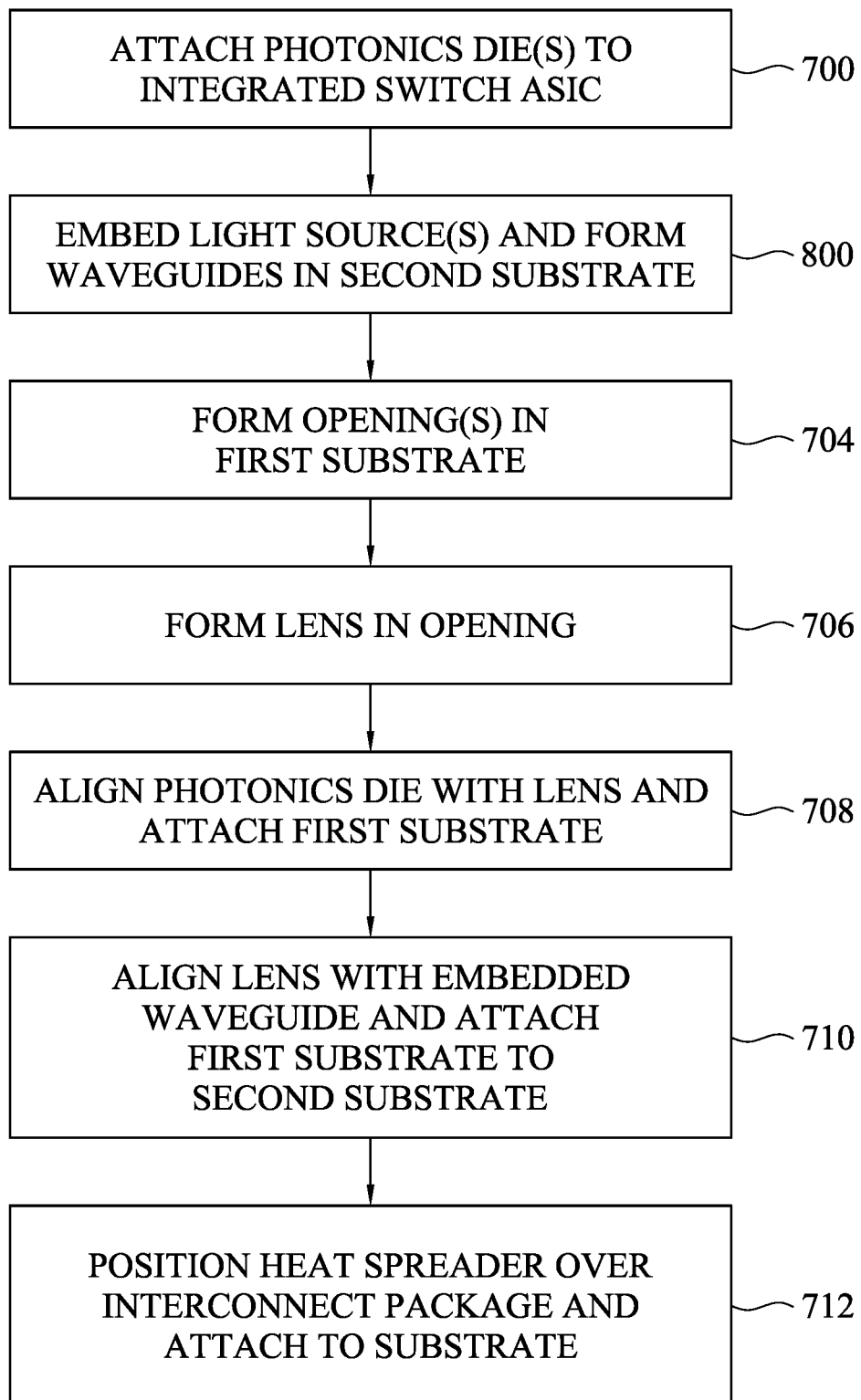
FIG. 8 is a flowchart of a second example method for forming an interconnect package in accordance with some embodiments.

FIG. 8 is a flowchart of a second example method for forming an interconnect package in accordance with some embodiments. In one embodiment, the process of FIG. 8 can be used to construct the interconnect package shown in FIGS. 4A-4B. Several of the operations are similar to the operations shown in FIG. 7 and for brevity are not discussed in detail in the description of FIG. 8.

Initially, at block 700, one or more photonics dies 402 is attached to an integrated switch ASIC 202. Next, as shown in block 800, one or more waveguides 408 are formed in a second substrate 404 and one or more light sources 218 are disposed or embedded in the second substrate 404. Each light source 218 can be optically aligned with one or more waveguides 408 when positioned in the second substrate 404.

One or more openings are then formed in a first substrate 412 and a lens 410 is formed in each opening (blocks 704, 706). Each photonics die 402 is optically aligned with a lens 410 and the interconnect package is attached to the first substrate 412 (block 708). Next, as shown in block 710, each lens 410 is optically aligned with one or more embedded waveguides 408 and the first substrate 412 is attached to the second substrate 404 to produce an interconnect package. A heat spreader (e.g., 248 in FIG. 2B) can be positioned over the interconnect package and attached to a substrate (block 712).

Figure 9:
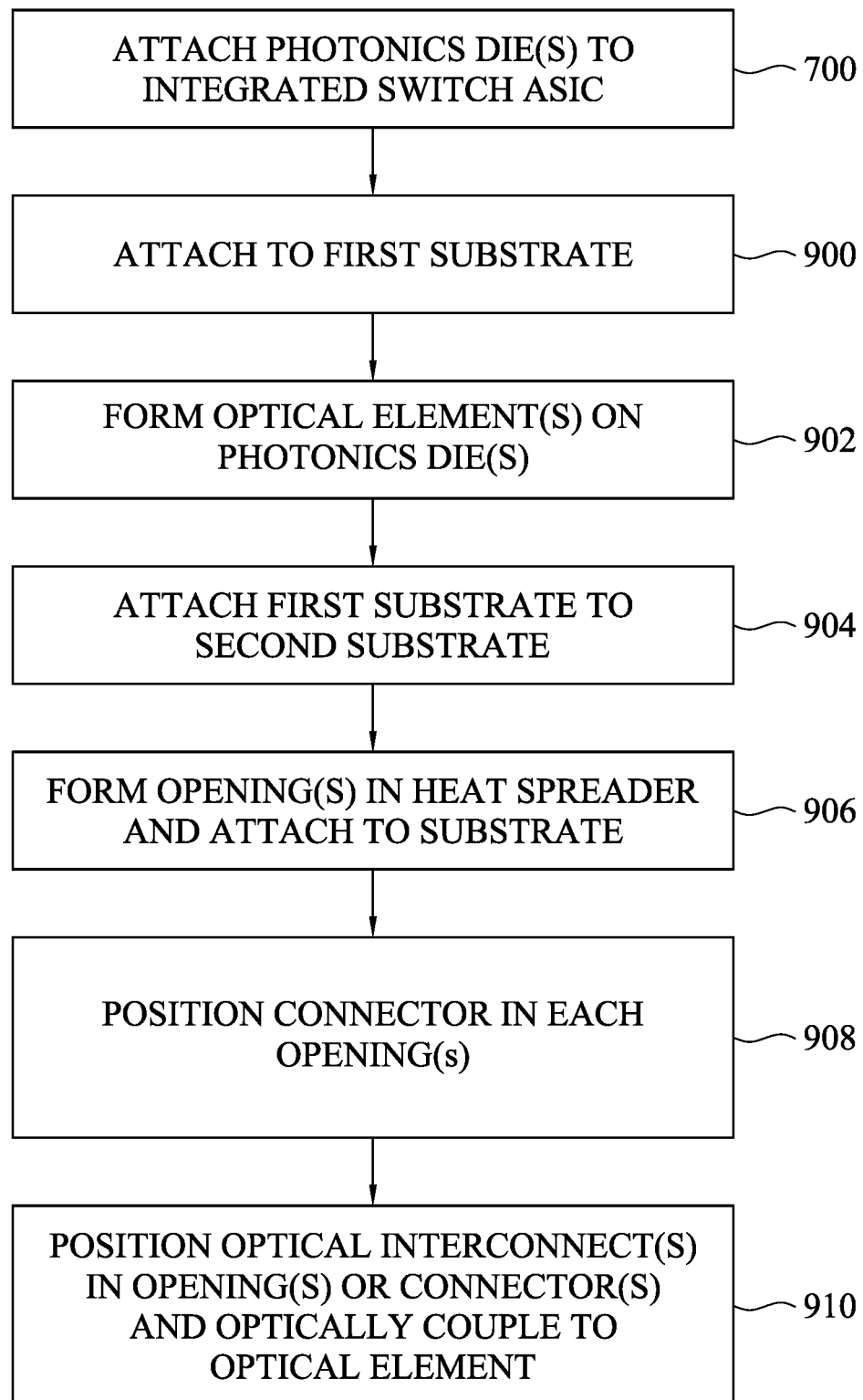
FIG. 9 is a flowchart of a third example method for forming an interconnect package in accordance with some embodiments.

FIG. 9 is a flowchart of a third example method for forming an interconnect package in accordance with some embodiments. In one embodiment, the process of FIG. 9 can be used to construct the interconnect package shown in FIGS. 5 and 6. Several of the operations are similar to the operations shown in FIG. 7 and for brevity are not discussed in detail in the description of FIG. 9.

Initially, at block 700, one or more photonics dies 504, 604 is attached to an integrated switch ASIC (e.g., 202 in FIG. 2A). Next, as shown in block 900, the interconnect package is attached to a first substrate 507, 607 using any suitable technique. One or more optical elements 502, 602 can be formed on one or more surfaces of the photonics die 504, 604 (block 902) and the first substrate 507, 607 attached to the second substrate (e.g., 242 in FIG. 2C) (block 904).

Next, as shown in block 906, one or more openings are formed in a heat spreader 510, 610 and the heat spreader is attached to a substrate (e.g., first substrate 507, 607). Any suitable technique can be used to form the opening(s) in the heat spreader, such as by etching or drilling. Optionally, a connector 508, 608 can be positioned in each opening at block 908. The connector(s) can be positioned before or after the heat spreader is attached to the substrate. An optical interconnect 506, 606 such as an optical fiber, is positioned in each opening or connector 508, 608 and attached and optically coupled to an optical element 502, 602.

Although the blocks shown in FIGS. 7-9 are shown in a particular order, in other embodiments the order of the blocks can be arranged differently. For example, blocks 702, 704, and 706 can be performed before block 700 in FIG. 7. Additionally, new blocks can be added to the methods, or blocks may be deleted from the methods. For example, in some instances, blocks 704 and 706 may be omitted.

In one embodiment, an interconnect package includes a pDie and an integrated switch ASIC integrated into one package. The pDie includes a detector. The integrated switch ASIC includes a switch ASIC including one or more switches and one or more components of an eDie. The one or more components of the eDie can include, but are not limited to, at least one of serializer/deserializer circuitry or control circuitry. The one or more components of the eDie are electrically connected to the pDie.

In another embodiment, a device includes a substrate and an interconnect package attached to the substrate. The interconnect package includes a pDie and an integrated switch ASIC integrated into one package. The integrated switch ASIC is configured for control, serializer/deserializer, and switch functions. The pDie includes a plurality of detectors and is attached and electrically connected to the integrated switch ASIC.

In some embodiments, a method for producing an interconnect device for optical communications includes attaching a pDie to an integrated switch ASIC to produce an interconnect package. The pDie includes a detector and the integrated switch ASIC includes one or more switches, serializer/deserializer circuitry, and control circuitry. The serializer/deserializer circuitry and the control circuitry are electrically connected to the pDie. A lens is positioned in an opening of a substrate and the interconnect package is attached to the substrate. The lens is optically aligned with the detector in the pDie.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect package, comprising:
   a substrate;
   an integrated switch Application Specific Integrated Circuit (ASIC) attached to the substrate, the integrated switch ASIC comprising one or more switches and one or more serializer/deserializer circuits; and
   a photonics die (pDie) attached and electrically connected to the integrated switch ASIC, the pDie comprising a plurality of detectors and a plurality of light sources arranged in pairs of a light source and a detector, wherein the pairs are arranged into one or more clusters on the pDie, wherein the pDie is disposed in a cutout formed in the substrate, and wherein the integrated switch ASIC and the pDie are arranged in a diving-board configuration such that a portion of the pDie extends beyond an edge of the integrated switch ASIC to provide an exposed surface.

2. The interconnect package of claim 1, wherein the integrated switch ASIC further comprises one or more transceivers.

3. The interconnect package of claim 1, wherein the integrated switch ASIC further comprises one or more clocking circuits.

4. The interconnect package of claim 1, wherein;
   the substrate comprises a first substrate; and
   the interconnect package further comprises:
      an optical element formed in an opening in the first substrate and optically aligned with a respective light source;
      a second substrate attached to the first substrate; and
      a waveguide formed in the second substrate and optically aligned with the optical element to optically couple the respective light source to the waveguide.

5. The interconnect package of claim 4, wherein:
   the optical element is aligned with a first end of the waveguide; and
   the interconnect package further comprises an optical interconnect optically coupled to a second end of the waveguide.

6. The interconnect package of claim 4, wherein a heat spreader is positioned over the interconnect package and attached to one of the first substrate or the second substrate.

7. The interconnect package of claim 1, further comprising an optical coupler attached to the exposed surface.

8. A device, comprising:
   a substrate; and
   an interconnect package connected to the substrate, the interconnect package comprising a photonics die (pDie) and an integrated switch ASIC Application Specific Integrated Circuit (ASIC) integrated into one package, wherein:
      the integrated switch ASIC comprises one or more serializer/deserializer circuits positioned around a periphery of the integrated switch ASIC, the integrated switch ASIC comprising one or more switches; and
      the pDie is attached and electrically connected to the integrated switch ASIC and comprises a plurality of detectors and a plurality of light sources arranged in pairs of a light source and a detector, wherein the pairs are arranged into one or more clusters on the pDie, wherein the pDie is disposed in a cutout formed in the substrate, and wherein the integrated switch ASIC and the pDie are arranged in a diving-board configuration such that a portion of the pDie extends beyond an edge of the integrated switch ASIC to provide an exposed surface.

9. The device of claim 8, further comprising a plurality of transceivers positioned around the periphery of the integrated switch ASIC.

10. The device of claim 8, further comprising a plurality of clocking circuits positioned around the periphery of the integrated switch ASIC.

11. The device of claim 8, further comprising an optical element formed in or at an opening in the substrate and optically aligned with a respective light source.

12. The device of claim 11, wherein the integrated switch ASIC and the pDie are arranged in the diving-board configuration such that the opening in the substrate is formed below the portion of the pDie that extends beyond the edge of the integrated switch ASIC.

13. The device of claim 11, wherein:
   the substrate is a first substrate; and
   the device further comprises:
      a second substrate attached to the first substrate; and a waveguide embedded in the second substrate and optically aligned with the optical element to optically couple the respective light source to the waveguide.

14. The device of claim 13, wherein:
the opening is a first opening;
the optical element is a first optical element;
the waveguide is a first waveguide; and
the device further comprises:
   a second optical element formed in or at a second opening in the first substrate and optically aligned with a respective detector; and
   a second waveguide embedded in the second substrate and optically aligned with the second optical element to optical couple the respective detector to the second waveguide.

15. A method for producing an interconnect device for optical communications, the method comprising:
attaching a photonics die (pDie) to an integrated switch ASIC Application Specific Integrated Circuit (ASIC) to produce an interconnect package;
attaching the interconnect package to a substrate, wherein:
   the pDie is positioned in a cutout formed in the substrate;
   the pDie comprises a plurality of light sources and a plurality of detectors arranged in pairs of a light source and a detector and the pairs are arranged into one or more clusters on the pDie, wherein the integrated switch ASIC and the pDie are arranged in a diving-board configuration such that a portion of the pDie extends beyond an edge of the integrated switch ASIC to provide an exposed surface; and
   the integrated switch ASIC comprises a serializer/deserializer circuitry electrically connected to the pDie; and positioning an optical element at an opening of the substrate, wherein the optical element is optically aligned with a respective light source on the pDie.

16. The method of claim 15, wherein:
the substrate comprises a first substrate;
the opening in the first substrate comprises a first opening;
the optical element comprises a first optical element;
the pDie comprises a light source; and
the method further comprises positioning a second optical element at a second opening in the first substrate, wherein the second optical element is optically aligned with a respective detector on the pDie.

17. The method of claim 16, wherein:
the substrate comprises a first substrate; and
the method further comprises:
   providing a first waveguide in a second substrate;
   providing a second waveguide in the second substrate; and
   attaching the second substrate to the first substrate, wherein the first waveguide is optically aligned with the first optical element and the second waveguide is optically aligned with the second optical element.

18. The method of claim 17, further comprising optically coupling a first interconnect to the first waveguide and optical coupling a second interconnect to the second waveguide.

19. The method of claim 15, further comprising positioning a heat spreader over the interconnect package and attaching the heat spreader to the substrate.

20. The device of claim 8, further comprising a heat spreader positioned over the interconnect package.

* * * * *